United States Patent [19]

McMurray

[11] Patent Number: 4,745,513
[45] Date of Patent: May 17, 1988

[54] PROTECTION OF GTO CONVERTERS BY EMITTER SWITCHING

[75] Inventor: William McMurray, Schenectady, N.Y.

[73] Assignee: General Electric Company, Schenectady, N.Y.

[21] Appl. No.: 907,418

[22] Filed: Sep. 15, 1986

[51] Int. Cl.[4] .............................................. H02H 3/08
[52] U.S. Cl. .......................................... 361/56; 361/18; 361/55; 361/91; 361/104; 363/57
[58] Field of Search .................. 361/18, 56, 58, 55, 361/61, 88, 91, 100, 104; 363/50, 57, 58; 307/252 C; 323/276, 277

[56] References Cited

U.S. PATENT DOCUMENTS

| | | | |
|---|---|---|---|
| 4,280,161 | 7/1981 | Kuhn et al. | 361/104 X |
| 4,322,771 | 3/1982 | Struger | 361/104 |
| 4,390,826 | 6/1983 | Erdman et al. | 318/439 |
| 4,593,204 | 6/1986 | McMurray | 307/252 C |
| 4,611,267 | 9/1986 | McMurray | 363/58 |
| 4,631,621 | 12/1986 | Howell | 361/56 X |

Primary Examiner—A. D. Pellinen
Assistant Examiner—Todd E. DeBoer
Attorney, Agent, or Firm—Marvin Snyder; James C. Davis, Jr.

[57] ABSTRACT

A fault current protection arrangement for a power converter circuit utilizes gate turn-off thyristors as electronic switching devices. A gate turn-off thyristor is connected between relatively positive and negative voltage buses with a circuit interruption device connected in electrical series arrangement with a cathode terminal of the thyristor. A gate driver circuit is connected for providing control signals to the gate terminal of the thyristor for controlling its on and off states during normal operation. Upon detection of the fault current condition, the gate driver circuit is inhibited and the interruption device open-circuits the cathode terminal of the thyristor to divert current in the thyristor into the gate terminal. The resulting anode-to-gate current results in rapid turn-off of the thyristor.

8 Claims, 2 Drawing Sheets

PROTECTION OF GTO CONVERTERS BY EMITTER SWITCHING

The present invention relates to electronic power converter circuits and, more particularly, to a method and apparatus for fault current protection of gate turn-off thyristor converter circuits.

BACKGROUND OF THE INVENTION

Gate turn-off thyristors (GTOs) are semiconductor switching devices which can be turned on and off by supplying bidirectional current to a gate or control terminal of the device. In addition to a control or gate terminal, the GTO has an anode and a cathode terminal. Current into the gate terminal will forward bias the GTO and allow an anode-to-cathode current. By reversing polarity of the gate current so that an anode-to-gate current path is formed, the anode-to-cathode voltage reverses and the GTO turns off. Thus, GTOs require gate drive current of two polarities. One form of gate drive circuit is shown in W. McMurray U.S. Pat. No. 4,593,204 issued June 3, 1986 and assigned to the assignee of the present invention.

The unique ability of the GTO to be turned off or commutated by reversing current polarity at the gate terminal has made the device popular in power converter circuits such as inverters and choppers. For such use, however, there are drawbacks to using circuits heretofore devised for effectively commutating the GTO under fault current conditions. Such condition may occur, for example, in an inverter in which two or more GTOs become simultaneously conductive and short-circuit a power source. Attempts to protect GTO converter circuits under fault current conditions have generally required bulky and costly extra components along with fast fault detection and complex special action by gated drive circuits.

SUMMARY OF THE INVENTION

Among the objects of the present invention is the provision of a simple and low cost method of protecting GTO converters. The present invention takes advantage of the rapid turn off capability of the GTO in response to anode-to-gate current. Additionally, the relatively low voltage potential between cathode and gate terminals during anode-to-cathode conduction is advantageously utilized.

In an illustrative embodiment, the present invention comprises a circuit interruption device connected in series circuit arrangement with a cathode terminal of a GTO. Occurrence of a fault results in excessive current through the GTO, opening the circuit interruption device and thereby diverting the anode-to-cathode current into the gate terminal. This action reverses polarity of current in the gate terminal and forces the GTO to turn off in an emitter-switched mode with unity turn off gain. An advantage of this arrangement is that the GTO can turn off at a much higher current than its normal rating. The duration of any fault current is limited to the opening time of the circuit interruption device. The turn off time of the GTO is essentially negligible in comparison to the opening time of the circuit interruption device. Furthermore, the circuit interruption device is subject to only the gate-to-cathode voltage of the GTO and can thus be optimized for speed of opening rather than for arc interruption capability. The circuit interruption device may comprise a fuse or an electromagnetically operated circuit breaker. In the case of a circuit breaker, the actuation coil of the circuit breaker is positioned in the circuit at a point at which its inductance does not interfere with operation of the gate drive circuit or any snubber circuit associated with the GTO.

DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 1:
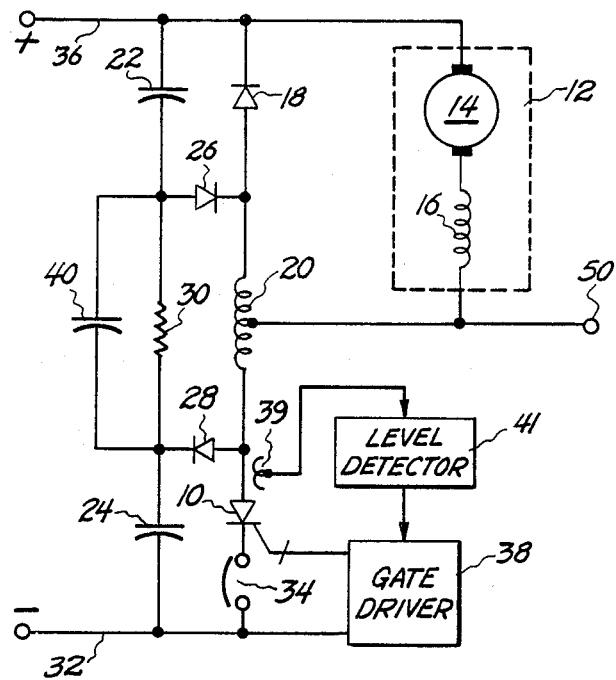
FIG. 1 is an illustration of a GTO chopper circuit incorporating a cathode circuit breaker in accordance with the present invention.

FIG. 1 shows one form of chopper circuit utilizing a gate turn-off thyristor (GTO) 10 for controlling power to a load 12, illustrated as a motor having an armature 14 and a field winding 16. As is well known, operation of motor 12 is controlled by switching GTO 10 between conductive and non-conductive states so as to regulate or control current through motor 12. During non-conductive states of GTO 10, motor current circulates through a freewheeling diode 18 due to inductive reaction of motor 12. Inductor 20 is a snubber inductance associated with the snubber circuit utilized to limit rate of change of current with respect to time when turning on and off the GTO. A detailed description of the snubber circuit of FIG. 1 can be had by reference to McMurray U.S. patent application Ser. No. 705,259 filed Feb. 25, 1985, now U.S. Pat. No. 4,611,267, issued Sept. 9, 1986 assigned to General Electric Company. Briefly, capacitors 22 and 24 act as shunt capacitor snubbers while diodes 26 and 28 operate to polarize the charging and discharging of the capacitors. A resistor 30 acts as a reset resistor and assists the charging and discharging of capacitors 22 and 24.

A cathode terminal of the GTO 10 is connected to a negative voltage bus 32 through a circuit interruption device 34. Device 34 is normally conductive so that when GTO 10 becomes conductive, current is provided to motor 12 from a positive voltage bus 36 via GTO 10 and negative voltage bus 32. The conductive and non-conductive states of GTO 10 are controlled by gate driver circuit 38 which has one terminal connected to the gate terminal of GTO 10 and at least a second terminal connected to negative voltage bus 32. The circuitry of gate driver 38 between the GTO gate terminal and negative voltage bus 32 establishes a gate-to-cathode bias voltage for GTO 10. Gate driver circuit 38 may be of the form disclosed in the aforementioned U.S. Pat. No. 4,593,204.

In the circuit of FIG. 1, circuit interruption device 34 comprises a circuit breaker which is energized by a solenoid. The inductive coil of the solenoid may be included in series snubber inductance 20. Since the voltage interruption capability of circuit breaker 34 need only be of a level sufficient to interrupt a gate-to-cathode voltage of GTO 10, circuit breaker 34 need have only a very low voltage rating. For example, a typical gate-to-cathode voltage would be in the range of 10 volts or less. Accordingly, the inductance of a coil necessary to operate a relatively low voltage contactor is small enough that the coil inductance can be included in the snubber inductance 20. However, if the design of the circuit is such that the coil inductance cannot be incorporated in snubber inductance 20, it can be placed in other areas of the circuit, such as in positive voltage bus 36, so long as the coil is not located in series with contacts 34 in the cathode circuit where its inductance would interfere with operation of gate driver circuit 38. If desired, the circuit breaker can be a non-resettable type and require a separate closing coil to be used for automatic restarting.

In operation, opening of interruption device 34 in the circuit of FIG. 1 causes the cathode current in GTO 10 to be diverted into gate driver circuit 38 via the gate terminal of GTO 10. Since gate driver circuit 38 is normally capable of supplying bidirectional current (by employing diodes in the gate driver circuit) reverse current flow from the gate terminal of GTO 10 is facilitated. Typically, the reverse current is gated by diodes in gate driver circuit 38. These diodes should be selected to pass surge current through the GTO gate terminal at the instant that circuit interruption device 34 opens. Such surge current, while relatively large, lasts only a few microseconds. The gate turn off current is generated automatically when circuit interruption device 34 opens. Because gate driver circuit 38 should not attempt to turn off GTO 10 prior to opening of interruption device 34, any additional fault detection circuitry in the system should be interconnected to gate driver circuit 38 so as to suppress any such action by the gate driver circuit at that time. Attempts by the gate driver circuit to turn off the GTO under a fault condition will likely be ineffectively and could interfere with the inventive turn-off arrangement. The system thus preferably incorporates a high-speed fault detection circuit responsive to initiation of a fault current for inhibiting operation of gate driver circuit 38. Such detection circuit may include a current transformer 39 providing a signal representative of current rise time and a level detection circuit 41 (such as a Schmitt trigger circuit) for providing a signal to inhibit driver circuit 38 in the event of a fault current.

Snubber diodes 26 and 28 must be of sufficient current capacity to carry the surge current for a short time after GTO 10 turns off. Such time is occasioned by dissipation, in resistance 30, of the energy trapped in series inductance 20. Resistance 30 should also be selected sufficiently small such that the resulting voltage occasioned by dissipation of the energy from inductance 20 does not exceed the peak rating of GTO 10. In order to limit the peak voltage across resistance 30 after a fault current condition, a capacitor 40 may be connected across resistor 30. Use of capacitor 40 also allows the size of resistance 30 to be increased, resulting in a faster discharge of the snubber circuit during normal operations.

It will be noted that a failure of GTO 10, such as by an anode-to-cathode short circuit, would render the GTO turn-off system using circuit breaker 34 relatively inoperative. Although circuit interruption device 34 would attempt to open, a short circuit through GTO 10 would result in a larger voltage being reflected across the contacts of circuit breaker 34. The larger voltage would likely result in arcing of low voltage contacts. Accordingly, an additional protection device, such as a fuse in the DC supply connected to voltage buses 36 and 32, is necessary to back up circuit interruption device 34. It should also be noted that while circuit interruption means 34 has been illustrated as a low voltage circuit breaker, a low voltage fuse, optimized for speed of opening, could be utilized as circuit interruption device 34. The disadvantage of utilizing a fuse, however, is that the circuit could not be restarted without replacing the fuse.

Figure 2:
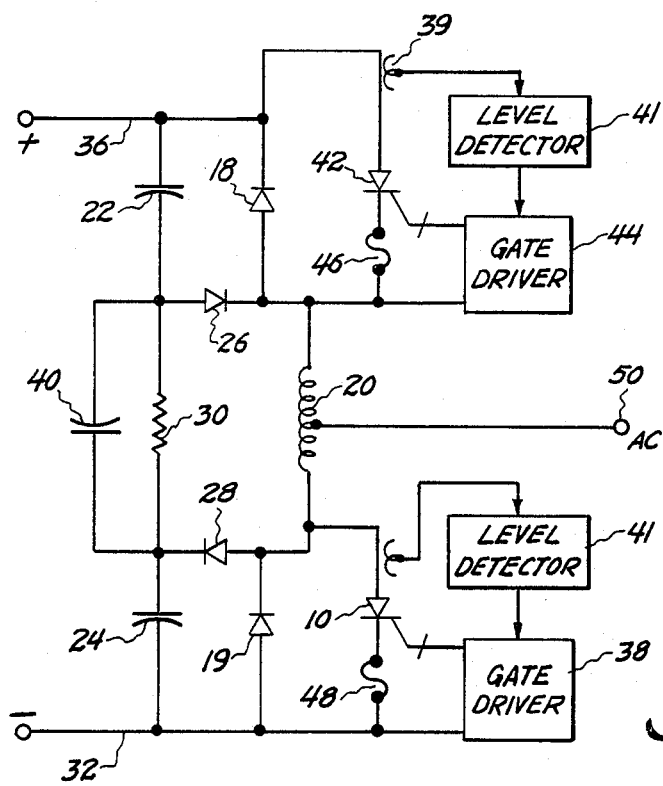
FIG. 2 is representative of a single leg of an inverter circuit utilizing a pair of GTOs protected by cathode fuses.

FIG. 2 is an illustration of one leg of a multi-phase inverter using a pair of gate turn-off devices, each of which is protected by circuit interruption devices connected in their respective cathode circuits. In the inverter circuit, there is provided an additional gate turn-off device 42 connected between voltage bus 36 and snubber inductance 20. A gate driver circuit 44 connected between the gate and cathode of a GTO 42 provides on and off bi-directional current to the gate terminal of GTO 42 to control its conductive and non-conductive states. In the embodiment of FIG. 2, the circuit interruption devices are illustrated as fuses 46 and 48, each of which is connected to a cathode terminal of a corresponding one of GTOs 42 and 10. The circuit of FIG. 2 is essentially identical to the circuit of FIG. 1 with the exception of additional GTO 42 and a freewheeling diode 19 connected in a reverse parallel conduction path across GTO 10. Accordingly, the reference numbers applied to the elements of FIG. 2 are the same as used with the elements of FIG. 1. In both circuits of FIGS. 1 and 2, snubber inductance 20 includes a center tap connection for connecting to a load terminal 50.

As is well known, the inverter operates by alternately switching current in a bidirectional manner at load terminal 50. When GTO 42 is gated into conduction, current from positive voltage bus 36 passes through GTO 42, an upper section of inductor 20 and out through load terminal 50. When GTO 42 is gated out of conduction and GTO 10 is gated into conduction, current at terminal 50 reverses direction and passes through the lower section of inductor 20 down through GTO 10 to negative voltage bus 32. A complete description of a plural-phase inverter may be had by reference to Erdman et al. U.S. Pat. No. 4,390,826, issued June 28, 1983 and assigned to the instant assignee. If GTOs 42 and 10 are simultaneously conductive, an essentially short-circuit condition exists between voltage buses 36 and 32. Under those conditions, it is necessary and desirable to interrupt the current path as quickly as possible to prevent damage to the power supply or to other components connected to the circuit. With the present invention, an overcurrent condition causes the cathode circuits of the GTOs to be opened and forces current to be diverted into the gate circuits. In each GTO, current from its anode-to-gate circuit causes it to be rapidly gated out of conduction. Most significant is the fact that circuit interruption devices 46 and 48 are only required to interrupt a very low voltage, i.e., the voltage existing between the gate and cathode terminals of the respective GTOs. If automatic restarting were desirable in the inverter circuit, fuses 46 and 48 could be replaced by circuit breakers, in which case inductance 20 may still be utilized as the coil of the solenoid controlling the circuit breakers by merely adding an additional set of contacts to the set illustrated in FIG. 1.

Figure 3:
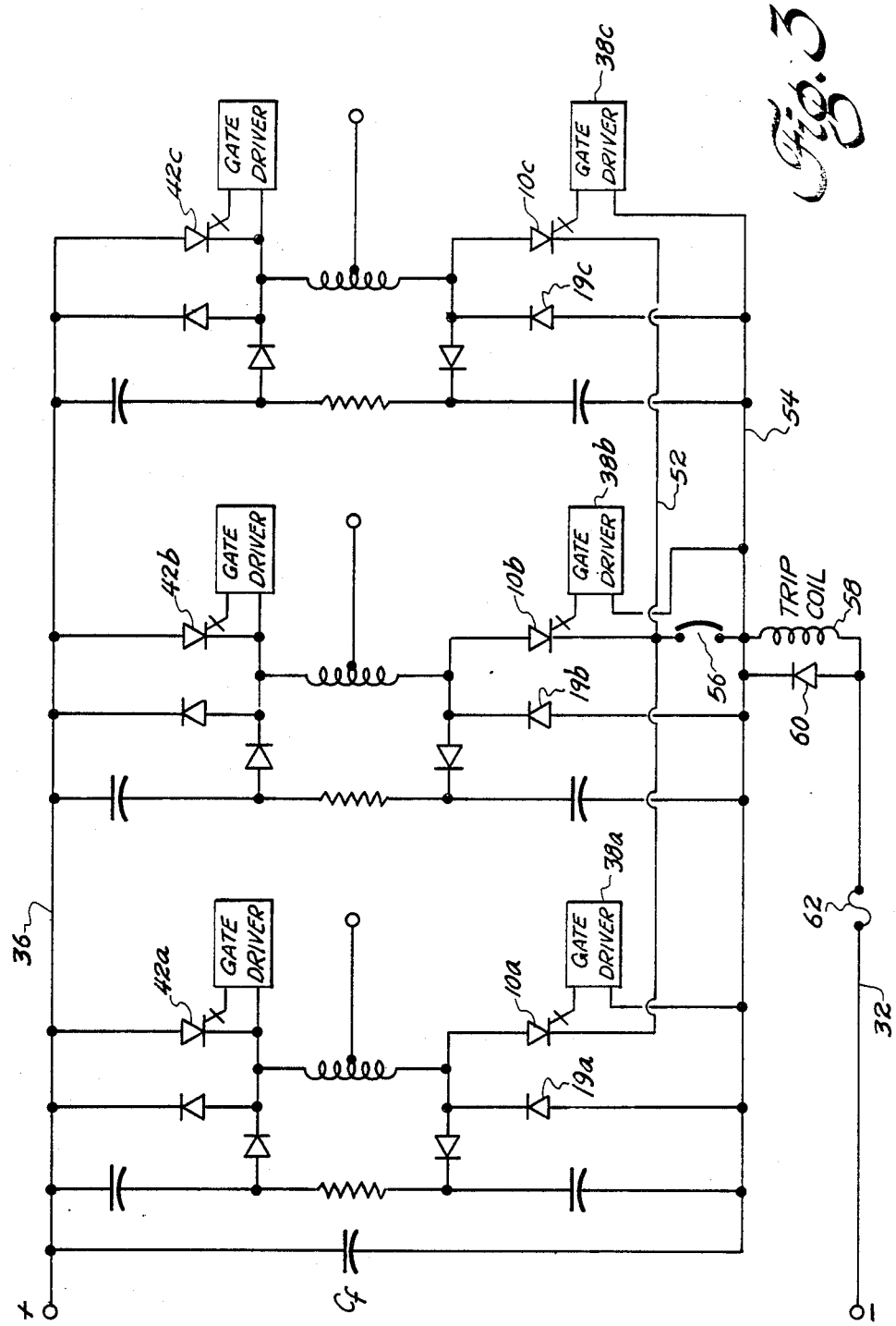
FIG. 3 illustrates application of the present invention to a multiphase inverter circuit using plural GTOs with only a single cathode circuit interruption device.

FIG. 3 illustrates a complete three-phase bridge GTO inverter circuit which employs a single cathode circuit breaker to interrupt current in all three phases. Since each of the phases utilized in the three-phase bridge circuit of FIG. 3 is essentially identical to the circuit in FIG. 2, the description of the elements and components of the individual phases will be omitted. For simplicity, level detectors 41 and current transformers 39 are not shown. In FIG. 3, the cathode terminals of each of GTO devices 10a, 10b and 10c are connected to a common terminal 52, which is connected to a circuit reference terminal 54 through a circuit interruption device 56.

Filter capacitor $C_f$, which supplies the current during switching, is connected between positive bus 36 and reference terminal 54. The serially connected snubber circuits are connected between bus 36 and terminal 54 rather than between bus 36 and negative bus 32. Reference terminal 54 is connected to negative voltage bus 32 by means of a trip coil or actuation coil 58 for circuit interruption device 56. A fly-back diode 60 is connected in parallel with trip coil 58. FIG. 3 also illustrates use of a back-up fuse 62 connected in negative voltage bus 32. Circuit breaker 56 remains in the gate-to-cathode circuit of each of GTO devices 10a, 10b and 10c. To ensure unity gain emitter switching of all three GTOs 10a, 10b and 10c when circuit breaker 56 opens during a fault current condition, the voltage drop produced by fault current through any one of gate driver circuits 38a, 38b and 38c should be less than the reverse avalanche voltage of any of the gate-to-cathode junctions of GTO devices 10a, 10b and 10c. If the avalanche voltage is lower than the gate driver voltage drop, the cathode current of any one of GTO devices 10a, 10b and 10c may force another of GTO devices 10a, 10b and 10c into gate avalanche and thereby bypass its own gate.

As described above with regard to FIGS. 1 and 2, to prevent any attempt to turn off any GTO in the normal mode before circuit breaker 56 opens, occurrence of the fault should be detected and cause immediate suppression of all six gate driver circuits. The suppression would prevent the gate driver circuits from providing any gate output signal or at least allow only low power reverse voltage. This suppression is necessary since any turn off attempt by the gate driver circuits at such high levels of current that exist during a fault condition would very likely not result in the gate driver circuits being able to turn off the GTO devices. It should be noted that trip coil 58 positioned in the negative voltage bus opens circuit interruption device 56 when any one of the stages of the three-phase inverter exhibits a fault current condition.

The common circuit breaker emitter switching arrangement in FIG. 3 will suppress load faults and allow subsequent restarting of the inverter after the fault condition has been cleared. However, if a fault is caused by failure of a gate turn-off device or of a feedback diode on the negative voltage bus, the current through the gate turn-off device will continue flowing in its gate terminal even after circuit interruption device 56 opens. Normally, reverse breakdown current through any one of diodes 19a, 19b or 19c will bypass interruption device 56. Accordingly, negative voltage bus 32 includes a conventional high voltage DC fuse 62, which is slower than circuit interruption device 56, to interrupt power to the inverter circuit. Fuse 62 could, alternatively, be replaced by a resettable circuit breaker.

From the above, it will be appreciated that when has been described is an improved fault current protection system for use with gate turn-off device voltage converters. The invention allows use of high speed, low voltage interruption devices for quickly terminating current in a gate turn-off device, and utilizes the characteristics of the device to divert anode-to-cathode current into turn-off current.

While the invention has been described in what is presently considered to be a preferred embodiment, many variations, changes and substitutions will become apparent to those skilled in the art without departing from the scope of the invention. Accordingly, it is intended that the invention be limited only to the scope and spirit of the appended claims.

What is claimed is:

1. A fault current protected power converter circuit comprising:
   circuit means adapted to be connected between relatively positive and negative voltage buses, said circuit means including at least one gate turn-off thyristor;
   a gate driver circuit for providing control signals to a gate terminal of said thyristor, said driver circuit connected to provide a bias voltage between said gate terminal and a cathode terminal of said thyristor;
   circuit interruption apparatus serially connected with said cathode terminal of said thyristor; and
   means responsive to an overcurrent condition for causing said interruption apparatus to open-circuit said cathode terminal for forcing current in said thyristor to be diverted to said gate terminal for effecting rapid turn-off of said thyristor, said means responsive to an overcurrent condition comprising a solenoid having a coil connected in series circuit with said thyristor.

2. An inverter for connection between relatively positive and negative voltage buses comprising:
   a first gate turn-off thyristor having an anode terminal connected to said positive voltage bus;
   a first gate driver circuit connected for supplying bidirectional current to a gate terminal of said first thyristor for rendering said first thyristor alternately conductive and non-conductive;
   a first current interruption means connected between a cathode terminal of said first thyristor and a load terminal for open-circuiting said cathode terminal upon detection of an overcurrent condition to thereby force current through said gate terminal to thereby effect a rapid turn-off of said first thyristor;
   a second gate turn-off thyristor having an anode terminal coupled to said load terminal;
   a second gate driver circuit connected for supplying bidirectional current to a gate terminal of said second thyristor for rendering said second thyristor alternately conductive and non-conductive; and
   a second current interruption means connected between a cathode terminal of said second thyristor and said negative voltage bus for open-circuiting the cathode terminal of said second thyristor upon detection of an overcurrent condition to thereby force current through the gate terminal of said second thyristor to effect a rapid turn-off of said second thyristor.

3. The inverter of claim 2 wherein each of said first and second current interruption means, respectively, comprises a fuse.

4. A multi-phase inverter for connection between relatively positive and negative voltage buses comprising:

a plurality of inverter stages, each stage adapted to be connected between one of said buses and a common terminal and including at least first and second gate turn-off thyristors serially connected between said one of said buses and said common terminal; and circuit interruption means coupled between the common terminal and the other of said buses, said circuit interruption means being responsive to a fault current in at least one of said stages for interrupting the connection of said inverter stages to said other of said buses.

5. The inverter of claim 4 wherein each stage includes at least first and second serially connected snubber circuits, each snubber circuit being operatively associated with a corresponding one of said first and second thyristors, said snubber circuits being connected between said positive voltage bus and a negative voltage reference terminal, said circuit interruption means being connected between said common terminal and said reference terminal.

6. The multi-phase inverter of claim 4 wherein said one of said buses comprises the positive voltage bus and the other of said buses comprises the negative voltage bus.

7. The inverter of claim 4 wherein each stage includes at least first and second serially connected snubber circuits, each snubber circuit being operatively associated with a corresponding one of said first and second thyristors, said snubber circuits being connected between said one of said buses and a circuit reference terminal, said circuit interruption means being connected between said common terminal and said reference terminal and being responsive to current between said reference terminal and said other of said buses for interrupting said fault current.

8. The inverter of claim 7 wherein said one of said buses comprises the positive voltage bus and the other of said buses comprises the negative voltage bus.

* * * * *